(12) United States Patent
Hu et al.

(10) Patent No.: US 11,168,200 B2
(45) Date of Patent: Nov. 9, 2021

(54) RESIN COMPOSITION AND ARTICLE MADE THEREFROM

(71) Applicant: Elite Electronic Material (Zhongshan) Co., Ltd, Zhongshan (CN)

(72) Inventors: Zhilong Hu, Zhongshan (CN); Teng Xu, Zhongshan (CN)

(73) Assignee: ELITE ELECTRONIC MATERIAL (ZHONGSHAN) CO., LTD., Zhongshan (CN)

( * ) Notice: Subject to any disclaimer, the term of this patent is extended or adjusted under 35 U.S.C. 154(b) by 207 days.

(21) Appl. No.: 16/389,215

(22) Filed: Apr. 19, 2019

(65) Prior Publication Data

US 2020/0199329 A1 Jun. 25, 2020

(30) Foreign Application Priority Data

Dec. 25, 2018 (CN) .......................... 201811594759.1
Feb. 25, 2019 (CN) .......................... 201910138260.8

(51) Int. Cl.
*C08K 5/5313* (2006.01)
*C08F 220/14* (2006.01)
*C08J 5/24* (2006.01)
*C08J 5/18* (2006.01)
*H05K 1/03* (2006.01)
*C08F 212/36* (2006.01)

(52) U.S. Cl.
CPC .......... *C08K 5/5313* (2013.01); *C08F 212/36* (2013.01); *C08F 220/14* (2013.01); *C08J 5/18* (2013.01); *C08J 5/24* (2013.01); *H05K 1/0373* (2013.01); *C08J 2325/02* (2013.01); *C08J 2333/12* (2013.01); *C08J 2361/28* (2013.01); *C08J 2371/12* (2013.01); *C08J 2425/02* (2013.01); *C08J 2433/12* (2013.01); *C08J 2461/28* (2013.01); *C08J 2471/12* (2013.01); *H05K 2201/012* (2013.01)

(58) Field of Classification Search
CPC ......... C08F 212/36; C08F 220/14; C08J 5/18; C08J 5/24; H05K 1/0373
See application file for complete search history.

(56) References Cited

U.S. PATENT DOCUMENTS

2010/0240831 A1* 9/2010 Kim, II .................. C08L 69/00
524/878
2011/0009524 A1* 1/2011 Kwon ................. C08L 2666/04
523/122

(Continued)

*Primary Examiner* — John E Uselding
(74) *Attorney, Agent, or Firm* — Muncy, Geissler, Olds & Lowe, P.C.

(57) ABSTRACT

The present disclosure pertains to the technical field of resin composite materials and more particularly relates to resin compositions and articles made therefrom, including a resin film, a prepreg, a laminate or a printed circuit board, wherein the resin composition comprises a phosphorus-containing flame retardant of Formula (I) and a prepolymerized resin prepared at least from a divinylbenzene compound, an allyl resin and an acrylate resin. The resin compositions may be further used to make a resin film, a prepreg, a laminate or a printed circuit board, which has the properties of absence of branch-like pattern on laminate surface, high glass transition temperature, low ratio of thermal expansion, and high copper foil peeling strength.

15 Claims, 1 Drawing Sheet

(56) References Cited

U.S. PATENT DOCUMENTS

| | | | |
|---|---|---|---|
| 2012/0157318 A1* | 6/2012 | Findlay | C08L 33/02 |
| | | | 504/362 |
| 2013/0345358 A1* | 12/2013 | Findlay | C08G 18/6229 |
| | | | 524/558 |
| 2016/0362527 A1* | 12/2016 | Koes | C08J 5/24 |
| 2017/0166729 A1* | 6/2017 | Hu | C09D 5/18 |
| 2017/0260364 A1* | 9/2017 | Hsieh | C08K 5/53 |

* cited by examiner

RESIN COMPOSITION AND ARTICLE MADE THEREFROM

CROSS-REFERENCE TO RELATED APPLICATION

This application claims the priority benefits of China Patent Application No. 201811594759.1, filed on Dec. 25, 2018, and China Patent Application No. 201910138260.8, filed on Feb. 25, 2019, the entirety of which are hereby incorporated by reference herein and made as a part of this specification.

BACKGROUND

1. Field of the Disclosure

The present disclosure relates to a resin composition and more particularly to a resin composition useful for preparing a resin film, a prepreg, a laminate and a printed circuit board, and an article made therefrom.

2. Description of Related Art

Recently, due to the trend of miniaturization and multi-functionality of electronic products, printed circuit boards (PCBs) were developed toward high fineness and high density interconnection, increasing the demands on higher trace precision and smaller size and increased amount of through holes, and thereby presenting more challenges to the performance of conventional FR-4 materials. During PCB fabrication and application, laminates are subject to multiple thermal processes including lamination, hot melting or hot air flattening and component attachment and soldering, and laminate processing and assembly involves high temperature from thermal shock. The resin of laminates with low thermal resistance becomes softened or melted at mild high temperature conditions, which results in significant deterioration of mechanical and electrical properties. To improve the interconnection and installation reliability, laminates are required to have an acceptable surface appearance and to have higher thermal resistance, high glass transition temperature and low ratio of thermal expansion.

In order to reduce the signal loss at high speed transmission, low roughness copper foils are usually used in laminates to make circuits. To ensure failure caused by separation of circuits and laminates, copper foil peeling strength is another important property concerned by the PCB industry.

SUMMARY

Accordingly, the present disclosure provides a resin composition and an article made therefrom, capable of achieving properties including such as laminate surface absent of branch-like pattern, high thermal resistance, high glass transition temperature, low ratio of thermal expansion and high copper foil peeling strength. Also disclosed herein is an article made from the resin composition, such as a resin film, a prepreg, a laminate or a printed circuit board.

Particularly, purposes of the present disclosure are achieved by the technical solutions described below.

The resin composition according to the present disclosure comprises a prepolymerized resin and a phosphorus-containing flame retardant, wherein: the prepolymerized resin is prepared by prepolymerization of a composition which at least comprises a divinylbenzene compound, an allyl resin and an acrylate resin; and the phosphorus-containing flame retardant has a structure of DOPO-Ar-DOPO, wherein DOPO represents a 9,10-dihydro-9-oxa-10-phospha-phenanthrene-10-oxide group, and Ar represents benzene, naphthalene or anthracene.

In at least one embodiment, the divinylbenzene compound may be an ortho-divinylbenzene, a para-divinylbenzene, a meta-divinylbenzene or a combination thereof.

In at least one embodiment, the allyl resin may be a resin comprising allyl, diallyl or triallyl group, or its isomeric group, or a modified resin thereof. Preferably, the allyl resin comprises a triallyl resin. More preferably, the allyl resin comprises a triallyl isocyanurate resin (TAIC) or a triallyl cyanurate resin (TAC).

In at least one embodiment, the acrylate resin comprises the following acrylate group. For example, the acrylate resin may comprise a mono-functional acrylate resin, a bifunctional acrylate resin, a multi-functional acrylate resin or a combination thereof.

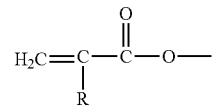

Wherein R is hydrogen or a $C_1$ to $C_6$ aliphatic group. Preferably, R is hydrogen or a methyl group.

The mono-functional acrylate resin is an acrylate resin containing one acrylate group per molecule. Examples include but are not limited to methyl (meth)acrylate, ethyl (meth)acrylate, propyl (meth)acrylate, n-butyl (meth)acrylate, i-butyl (meth)acrylate, t-butyl (meth)acrylate, 2-ethylhexyl (meth)acrylate, 3,5,5-trimethylhexyl acrylate, 2-naphthyl acrylate, 2-hydroxyethyl (meth)acrylate, 4-hydroxybutyl acrylate, ethylene glycol methyl ether acrylate, n-octyl (meth)acrylate, i-octyl (meth)acrylate, stearate (meth)acrylate, 2-hydroxypropyl (meth)acrylate, glycidyl (meth)acrylate, isobornyl methacrylate, allyl methacrylate, dicyclopentadienyl methacrylate, isononyl (meth)acrylate, isodecyl (meth)acrylate, lauryl (meth)acrylate and isomyristate (meth)acrylate.

The bifunctional acrylate resin is an acrylate resin containing two acrylate groups per molecule. Examples include but are not limited to 1,3-butanediol di(meth)acrylate, 1,4-butanediol di(meth)acrylate, 1,6-hexanediol di(meth)acrylate, 1,9-nonanediol di(meth)acrylate, 1,10-decanediol di(meth)acrylate, ethylene glycol di(meth)acrylate, diethylene glycol di(meth)acrylate, tetraethylene glycol di(meth)acrylate, polyethylene glycol di(meth)acrylate, 2-n-butyl-2-ethyl-1,3-propylene glycol di(meth)acrylate, dipropylene glycol di(meth)acrylate, tripropylene glycol di(meth)acrylate, polypropylene glycol di(meth)acrylate, neopentylene glycol di(meth)acrylate, ethylene oxide-added bisphenol A di(meth)acrylate, propylene oxide-added bisphenol A di(meth)acrylate, ethylene oxide-added bisphenol F di(meth)acrylate, dimethyloldicyclopentadienyl di(meth)acrylate, ethylene oxide-modified isocyanurate di(meth)acrylate, 2-hydroxy-3-(meth)acryloyloxy propyl (meth)acrylate, glycol carbonate di(meth)acrylate, polyether glycol di(meth)acrylate, polyester glycol di(meth)acrylate, polycaprolactone glycol di(meth)acrylate and polybutadiene glycol di(meth)acrylate.

The multi-functional acrylate resin is an acrylate resin containing three or more acrylate groups per molecule. Examples include but are not limited to trimethylolpropane tri(meth)acrylate, ethylene oxide-added trimethylolpropane tri(meth)acrylate, propylene oxide-added trimethylolpropane tri(meth)acrylate, caprolactone-modified trimethylolpropane tri(meth)acrylate, ethylene oxide-added isocyanurate tri(meth)acrylate, glycerol tri(meth)acrylate, propylene oxide-added glycerol tri(meth)acrylate, pentaerythritol tri(meth)acrylate, tri(meth)acryloylethyl phosphate, bis(trimethylol)propane tetra(meth)acrylate, pentaerythritol tetra(meth)acrylate, di-pentaerythritol penta(meth)acrylate and di-pentaerythritol hexa(meth)acrylate.

In at least one embodiment, 5-60 parts by weight of divinylbenzene compound, 25-75 parts by weight of allyl resin, and 5-50 parts by weight of acrylate resin are contained in the composition. In at least one embodiment, 10-50 parts by weight of divinylbenzene compound, 30-70 parts by weight of allyl resin, and 10-40 parts by weight of acrylate resin are contained in the composition.

Relative to 100 parts by weight of the prepolymerized resin, the ratio of content of divinylbenzene compound, acrylate resin and allyl resin may be 10:40:50, 20:10:70 or 50:20:30. In addition, relative to 100 parts by weight of the prepolymerized resin, the ratio of content of divinylbenzene compound, acrylate resin and allyl resin may also be 5:35:60, 60:10:30, 25:50:25, 35:5:60, 40:35:25 and 15:10:75.

According to the present disclosure, prepolymerization refers to the process of prepolymerizing one, two or more chemical substances to obtain a prepolymer. The prepolymerized resin of the present disclosure is obtained by prepolymerizing the aforesaid composition. In at least one embodiment, for example but not limited thereto, the composition is subject to prepolymerization in the presence of a peroxide at 60-120° C. for 1-4 hours, followed by filtration and purification to obtain the prepolymerized resin according to the present disclosure. In at least one embodiment, for example but not limited thereto, any divinylbenzene compound described above, any allyl resin described above and any acrylate resin described above are subject to prepolymerization in the presence of a peroxide at 60-120° C. for 1-4 hours, followed by filtration and purification to obtain the prepolymerized resin according to the present disclosure.

The prepolymerization described in the present disclosure refers to a conversion rate of the divinylbenzene compound of greater than 0% and less than 100% (exclusive of 0% and 100%), a conversion rate of the allyl resin of greater than 0% and less than 100% (exclusive of 0% and 100%), and a conversion rate of the acrylate resin of greater than 0% and less than 100% (exclusive of 0% and 100%), i.e., the overall conversion rate of the divinylbenzene compound, the allyl resin and the acrylate resin being of greater than 0% and less than 100% (exclusive of 0% and 100%).

Unless otherwise specified, according to the present disclosure, a resin may include a compound and/or a mixture, a compound may include a monomer and/or a polymer, and a mixture may include two or more compounds and may include a copolymer or auxiliaries, but not limited thereto.

A compound refers to a chemical substance formed by two or more elements bonded with chemical bonds and may be present as a monomer, a polymer, etc., but not limited thereto. A monomer refers to a compound which may participate in a polymerization or prepolymerization reaction to produce a high molecular weight compound. A homopolymer refers to a chemical substance formed by a compound via polymerization, addition polymerization or condensation polymerization, and a copolymer refers to a chemical substance formed by two or more compounds via polymerization, addition polymerization or condensation polymerization, but not limited thereto. In addition, the term polymer includes but is not limited to an oligomer. An oligomer refers to a polymer with 2-20, typically 2-5, repeating units.

In at least one embodiment, the DOPO groups contained in the phosphorus-containing flame retardant may be substituted or non-substituted, and the Ar group may also be substituted or non-substituted. Unless otherwise specified, the two DOPO groups, with respect to the Ar group, may be in ortho-, meta- or para-position, but not limited thereto. In one embodiment, Ar represents a benzene ring, and the two DOPO groups are in ortho-, meta- or para-position. In one embodiment, the phosphorus-containing flame retardant comprises a compound of Formula (I):

Formula (I)

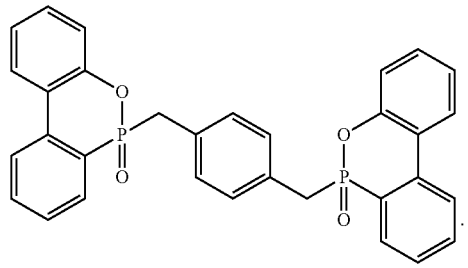

Unless otherwise specified, in the present disclosure, the relative content of the prepolymerized resin and the phosphorus-containing flame retardant may be adjusted according to the need. In one embodiment, the resin composition comprises 5 to 70 parts by weight of the prepolymerized resin and 10 to 70 parts by weight of the phosphorus-containing flame retardant. In another embodiment, the resin composition comprises 10 to 60 parts by weight of the prepolymerized resin and 20 to 60 parts by weight of the phosphorus-containing flame retardant.

In at least one embodiment, the resin composition may optionally further comprise divinylbenzene compound, allyl resin, acrylate resin, maleimide resin, polyphenylene ether resin, cyanate ester resin, polyolefin resin, epoxy resin, phenolic resin, benzoxazine resin, styrene maleic anhydride resin, polyester resin, amine curing agent, polyamide resin, polyimide resin or a combination thereof.

In at least one embodiment, the resin composition may optionally further comprise flame retardant, inorganic filler, curing accelerator, solvent, toughening agent, silane coupling agent or a combination thereof.

The present disclosure also provides an article made from the resin composition, such as a resin film, a prepreg, a laminate or a printed circuit board, but not limited thereto.

In at least one embodiment, articles made from the resin composition disclosed herein have one, more or all of the following properties:
  an article made from the resin composition of the present disclosure, such as a copper-free laminate, has a surface absent of branch-like pattern under visual inspection; and
  an article made from the resin composition of the present disclosure has a ratio of thermal expansion as measured with a thermomechanical analyzer by reference to IPC-TM-650 2.4.24.5 of less than 1.30%, such as less than or equal to 1.25%, such as between 0.90% and 1.25%, or such as between 0.88% and 1.03%.

In at least one embodiment, the present disclosure chooses the compound with a structure of DOPO-Ar-DOPO as the phosphorus-containing flame retardant, referred hereinafter as Di-DOPO compound below. Compared with prior arts, the phosphorus-containing flame retardant of the present disclosure has a high melting point (of greater than 270° C.), much higher than conventionally used low melting point non-reactive phosphorus-containing flame retardant such as phosphazene compounds (e.g., SPB-100 available from Otsuka Chemical Co., Ltd., having a melting point of about 110° C.) and phosphate ester compounds (e.g., PX-200 available from Daihachi Chemical Industry Co., Ltd., having a melting point of about 95° C.). Since DOPO has a low ionization property at high temperature, laminates made from the resin composition comprising the phosphorus-containing flame retardant have higher glass transition temperature, low ratio of thermal expansion, higher copper foil peeling strength, higher T300 thermal resistance and low modulus decay ratio.

In addition, the present disclosure chooses a divinylbenzene compound, an acrylate resin and an allyl resin to perform prepolymerization to form the prepolymerized resin. The prepolymerized resin, compared with non-prepolymerized resin (i.e., adding the aforesaid three components without subject to prepolymerization to a resin composition), may reduce volatilization of volatile components contained in the prepolymerized resin raw material, such as but not limited to reducing volatilization of the divinylbenzene compound, triallyl isocyanurate resin and other components during the preparation of the article.

For example, if the resin composition is added with the divinylbenzene compound individually, due to the volatile property of the divinylbenzene compound, the reactivity of the resin composition will be reduced and the reaction rate is lowered; after volatilization of the divinylbenzene compound, the dissipation factor (Df) of laminates made from the resin composition will be increased.

Moreover, for example, if the resin composition is added with a triallyl isocyanurate resin (TAIC, as an allyl resin) individually, due to the volatile property of TAIC, the glass transition temperature (Tg) of laminates made from the resin composition will be lowered and the ratio of thermal expansion will be increased.

In at least one embodiment, the present disclosure chooses a divinylbenzene compound, a mono-functional methacrylate resin and a triallyl isocyanurate resin to form a composition which is subject to prepolymerization to form a prepolymerized resin to be added to a resin composition comprising the aforesaid phosphorus-containing flame retardant, thereby increasing the copper foil peeling strength (P/S) of the laminate, increasing the glass transition temperature (Tg) and lowering the dissipation factor (Df).

In at least one embodiment, the present disclosure chooses a divinylbenzene compound, a mono-functional methacrylate resin and a triallyl isocyanurate resin to form a composition which is subject to prepolymerization to form a prepolymerized resin to be added to a resin composition comprising the aforesaid phosphorus-containing flame retardant, wherein when the content of the phosphorus-containing flame retardant is preferably 20-60 parts by weight and the content of the prepolymerized resin is preferably 10-60 parts by weight, articles made from the resin composition of the present disclosure have at least one, more or all properties described below:

having a glass transition temperature as measured by using a dynamic mechanical analyzer by reference to IPC-TM-650 2.4.24.4 of less than a glass transition temperature as measured by using a thermomechanical analyzer by reference to IPC-TM-650 2.4.24.5; for example, when the glass transition temperature as measured by using a dynamic mechanical analyzer by reference to IPC-TM-650 2.4.24.4 and the glass transition temperature as measured by using a thermomechanical analyzer by reference to IPC-TM-650 2.4.24.5 are both greater than or equal to 200° C., the glass transition temperature as measured by using a dynamic mechanical analyzer by reference to IPC-TM-650 2.4.24.4 is less than the glass transition temperature as measured by using a thermomechanical analyzer by reference to IPC-TM-650 2.4.24.5; and having a copper foil peeling strength as measured by using a tensile strength tester by reference to IPC-TM-650 2.4.8 of greater than or equal to 3.5 lb/in, such as between 3.5 lb/in and 4.1 lb/in.

DESCRIPTION OF THE EMBODIMENTS

Figure 1:
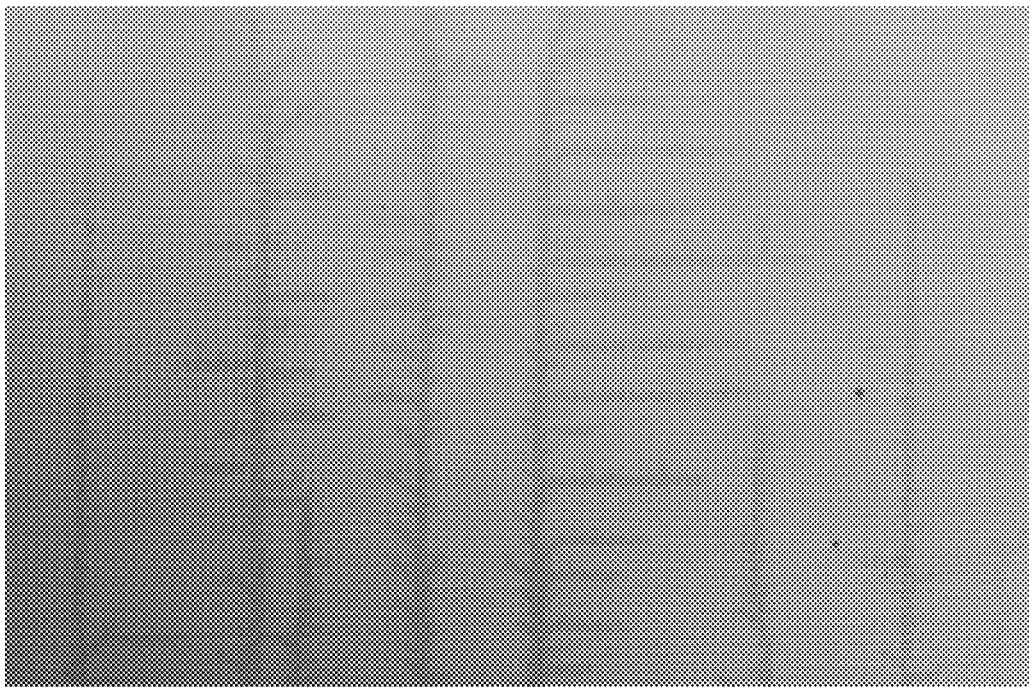
FIG. 1 illustrates a copper-free laminate having a surface with branch-like pattern.

To enable those skilled in the art to further appreciate the features and effects of the present disclosure, words and terms contained in the specification and appended claims are described and defined. Unless otherwise defined, all technical and scientific terms used herein have the same meaning as commonly understood by those of ordinary skill in the art to which this disclosure pertains. In the case of conflict, the present document and definitions contained herein will control.

As used herein, the term "comprises," "comprising," "includes," "including," "has," "having" or any other variant thereof is construed as an open-ended transitional phrase intended to cover a non-exclusive inclusion. For example, a composition or manufacture that comprises a list of elements is not necessarily limited to only those elements but may include other elements not expressly listed or inherent to such composition or manufacture. Further, unless expressly stated to the contrary, the term "or" refers to an inclusive or and not to an exclusive or. For example, a condition "A or B" is satisfied by any one of the following: A is true (or present) and B is false (or not present), A is false (or not present) and B is true (or present), and both A and B are true (or present). In addition, whenever open-ended transitional phrases are used, such as "comprises," "comprising," "includes," "including," "has," "having" or any other variant thereof, it is understood that transitional phrases such as "consisting essentially of" and "consisting of" are also disclosed and included.

In this disclosure, features or conditions presented as a numerical range or a percentage range are merely for convenience and brevity. Therefore, a numerical range or a percentage range should be interpreted as encompassing and specifically disclosing all possible subranges and individual numerals or values therein, particularly all integers therein. For example, a range of "1 to 8" should be understood as explicitly disclosing all subranges such as 1 to 7, 2 to 8, 2 to 6, 3 to 6, 4 to 8, 3 to 8 and so on, particularly subranges defined by all integers, as well as disclosing all individual values such as 1, 2, 3, 4, 5, 6, 7 and 8. Similarly, a range of "between 1 and 8" should be understood as explicitly disclosing all ranges such as 1 to 8, 1 to 7, 2 to 8, 2 to 6, 3 to 6, 4 to 8, 3 to 8 and so on and encompassing the end points of the ranges. Unless otherwise defined, the aforesaid interpretation rule should be applied throughout the present disclosure regardless broadness of the scope.

Whenever amount or other numeral or parameter is expressed as a range, a preferred range or a series of upper and lower limits, it is understood that all ranges defined by any pair of the upper limit or preferred value and the lower limit or preferred value are specifically disclosed, regardless whether these ranges are explicitly described or not. In addition, unless otherwise defined, whenever a range is mentioned, the range should be interpreted as inclusive of the endpoints and every integers and fractions in the range.

Given the intended purposes and advantages of this disclosure are achieved, numerals or figures have the precision of their significant digits. For example, 40.0 should be understood as covering a range of 39.50 to 40.49.

As used herein, a Markush group or a list of items is used to describe examples or embodiments of the present disclosure. A skilled artisan will appreciate that all subgroups of members or items and individual members or items of the Markush group or list can also be used to describe the present disclosure. For example, when X is described as being "selected from a group consisting of $X_1$, $X_2$ and $X_3$," it is intended to disclose the situations of X is $X_1$ and X is $X_1$ and/or $X_2$ and/or $X_3$. In addition, when a Markush group or a list of items is used to describe examples or embodiments of the present disclosure, a skilled artisan will understand that any subgroup or any combination of the members or items in the Markush group or list may also be used to describe the present disclosure. Therefore, for example, when X is described as being "selected from a group consisting of $X_1$, $X_2$ and $X_3$" and Y is described as being "selected from a group consisting of $Y_1$, $Y_2$ and $Y_3$," the disclosure includes any combination of X is $X_1$ and/or $X_2$ and/or $X_3$ and Y is $Y_1$ and/or $Y_2$ and/or $Y_3$.

The following embodiments and examples are illustrative in nature and are not intended to limit the present disclosure and its application. In addition, the present disclosure is not bound by any theory described in the background and summary above or the following embodiments or examples.

As described above, the present disclosure provides a resin composition comprising a prepolymerized resin and a phosphorus-containing flame retardant, wherein: the prepolymerized resin is prepared by prepolymerization of a composition which at least comprises a divinylbenzene compound, an allyl resin and an acrylate resin; and the phosphorus-containing flame retardant has a structure of DOPO-Ar-DOPO, wherein DOPO represents a 9,10-dihydro-9-oxa-10-phosphaphenanthrene-10-oxide group, and Ar represents benzene, naphthalene or anthracene.

In at least one embodiment, the DOPO groups contained in the phosphorus-containing flame retardant may be substituted or non-substituted, and the Ar group may also be substituted or non-substituted. Unless otherwise specified, the two DOPO groups, with respect to the Ar group, may be in ortho-, meta- or para-position, but not limited thereto. In one embodiment, Ar represents a benzene ring, and the two DOPO groups are in ortho-, meta- or para-position. In one embodiment, the phosphorus-containing flame retardant comprises a compound of Formula (I):

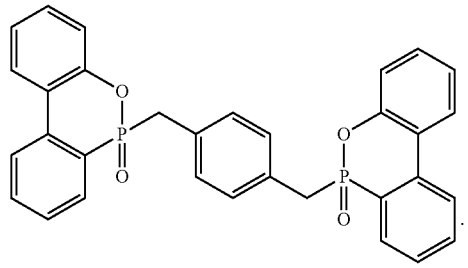

Formula (I)

In at least one embodiment, in the resin composition, the phosphorus-containing flame retardant has a content of preferably ranging from 10 to 70 parts by weight, and the prepolymerized resin has a content of preferably ranging from 5 to 70 parts by weight; in at least one embodiment, the phosphorus-containing flame retardant has a content of preferably ranging from 20 to 60 parts by weight, and the prepolymerized resin has a content of preferably ranging from 10 to 60 parts by weight.

Also disclosed herein is an article made from the resin composition, comprising a resin film, a prepreg, a laminate or a printed circuit board.

The resin composition disclosed herein may optionally further comprise divinylbenzene compound, allyl resin, acrylate resin, maleimide resin, polyphenylene ether resin, cyanate ester resin, polyolefin resin, epoxy resin, phenolic resin, benzoxazine resin, styrene maleic anhydride resin, polyester resin, amine curing agent, polyamide resin, polyimide resin or a combination thereof.

The divinylbenzene compound may be an ortho-divinylbenzene compound, a para-divinylbenzene compound, a meta-divinylbenzene compound or a combination thereof.

The allyl resin may comprise a resin having allyl, diallyl or triallyl group, or its isomeric group, or a modified resin thereof, or their combination. Preferably, the allyl resin is a triallyl resin. More preferably, the allyl resin comprises a triallyl isocyanurate resin (TAIC) or a triallyl cyanurate resin (TAC).

The acrylate resin comprises an acrylate group structure as shown below, including a mono-functional acrylate resin, a bifunctional acrylate resin, a multi-functional acrylate resin or a combination thereof.

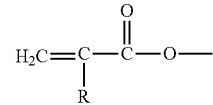

Wherein R is hydrogen or a $C_1$ to $C_6$ aliphatic group, including but not limited to methyl, ethyl, n-propyl, isopropyl, n-butyl, isobutyl, and tert-butyl, such as methyl, ethyl, n-propyl, or isopropyl. Preferably, R is hydrogen or a methyl group. Examples of acrylate suitable for the present disclosure include but are not limited to M55909, 76130, 67262, 424021, 411752, 411744, 41608, 246840, 407577, and 246794 available from Merck.

As used herein, the maleimide resin refers to a compound or a mixture containing at least one maleimide group. Unless otherwise specified, the maleimide resin used in the present disclosure is not particularly limited and may include any one or more maleimide resins useful for preparing a prepreg, a resin film, a laminate or a printed circuit board. Examples include but are not limited to 4,4'-diphenylmethane bismaleimide, oligomer of phenylmethane maleimide, m-phenylene bismaleimide, bisphenol A diphenyl ether bismaleimide, 3,3'-dimethyl-5,5'-diethyl-4,4'-diphenyl methane bismaleimide, 4-methyl-1,3-phenylene bismaleimide, 1,6-bismaleimide-(2,2,4-trimethyl)hexane, N-2,3-xylylmaleimide, N-2,6-xylenemaleimide, N-phenyl maleimide, maleimide resin containing aliphatic long-chain structure or a combination thereof. In addition, unless otherwise specified, the aforesaid maleimide resin of the present disclosure may also comprise a prepolymer thereof, such as a prepolymer of diallyl compound and maleimide resin, a prepolymer of diamine and maleimide resin, a prepolymer of multi-functional amine and maleimide resin or a prepolymer of acid phenol compound and maleimide resin, but not limited thereto.

For example, the maleimide resin may include products such as BMI-1000, BMI-1000H, BMI-1100, BMI-1100H, BMI-2000, BMI-2300, BMI-3000, BMI-3000H, BMI-4000H, BMI-5000, BMI-5100, BM-7000 and BMI-7000H available from Daiwakasei Co., Ltd., or products such as BMI-70 and BMI-80 available from K.I Chemical Industry Co., Ltd.

For example, the maleimide resin containing aliphatic long-chain structure may include products such as BMI-689, BMI-1400, BMI-1500, BMI-1700, BMI-2500, BMI-3000, BMI-5000 and BMI-6000 available from Designer Molecules Inc.

The polyphenylene ether resin described above may include any known polyphenylene ether resins used in the art, including but not limited to a hydroxyl-terminated polyphenylene ether resin, a vinyl-terminated polyphenylene ether resin, a maleimide-terminated polyphenylene ether resin, an anhydride-terminated polyphenylene ether resin or a cyanate-terminated polyphenylene ether resin. The vinyl-terminated polyphenylene ether resin is a vinyl-capped polyphenylene ether resin, wherein the capping vinyl group is a reactive vinyl group. Examples include but are not limited to vinylbenzyl-terminated polyphenylene ether resin (e.g., OPE-2st available from Mitsubishi Gas Chemical Co., Inc.), methacrylate-terminated polyphenylene ether resin (e.g., SA-9000 available from Sabic), vinylbenzyl-modified bisphenol A polyphenylene ether resin, vinyl-containing chain-extended polyphenylene ether resin or a combination thereof.

The cyanate ester resin described above may include any known cyanate ester resins used in the art, including but not limited to a cyanate ester resin with an Ar—O—CN structure (wherein Ar represents an aromatic group, such as benzene, naphthalene or anthracene), a phenol novolac cyanate ester resin, a bisphenol A cyanate ester resin, a bisphenol A novolac cyanate ester resin, a bisphenol F cyanate ester resin, a bisphenol F novolac cyanate ester resin, a dicyclopentadiene-containing cyanate ester resin, a naphthalene-containing cyanate ester resin, or a phenolphthalein cyanate ester resin. Examples of the cyanate ester resin include but are not limited to Primaset PT-15, PT-30S, PT-60S, BA-200, BA-230S, BA-3000S, BTP-2500, BTP-6020S, DT-4000, DT-7000, ULL950S, HTL-300, CE-320, LVT-50, or LeCy available from Lonza.

The polyolefin resin used herein may include any one or more polyolefin resins useful for preparing a prepreg, a resin film, a laminate or a printed circuit board. Examples include but are not limited to styrene-butadiene-divinylbenzene terpolymer, styrene-butadiene-maleic anhydride terpolymer, vinyl-polybutadiene-urethane oligomer, styrene butadiene copolymer, hydrogenated styrene butadiene copolymer, styrene isoprene copolymer, hydrogenated styrene isoprene copolymer, methyl styrene homopolymer, petroleum resin, cycloolefin copolymer and a combination thereof.

The phenolic resin used herein may be a mono-functional, bifunctional or multi-functional phenolic resin and is not particularly limited, including those currently used in the field to which this disclosure pertains. Preferably, the phenolic resin is selected from a phenoxy resin, a novolac resin or a combination thereof.

The benzoxazine resin used herein may include bisphenol A benzoxazine resin, bisphenol F benzoxazine resin, phenolphthalein benzoxazine resin, dicyclopentadiene benzoxazine resin, or phosphorus-containing benzoxazine resin, such as but not limited to LZ-8270 (phenolphthalein benzoxazine resin), LZ-8280 (bisphenol F benzoxazine resin), and LZ-8290 (bisphenol A benzoxazine resin) available from Huntsman or HFB-2006M available from Showa High Polymer.

The styrene maleic anhydride resin used herein may have a ratio of styrene (S) to maleic anhydride (MA) of 1:1, 2:1, 3:1, 4:1, 6:1, or 8:1, examples including but not limited to styrene maleic anhydride copolymers such as SMA-1000, SMA-2000, SMA-3000, EF-30, EF-40, EF-60 and EF-80 available from Cray Valley, or styrene maleic anhydride copolymers such as C400, C500, C700 and C900 available from Polyscope. Additionally, the styrene maleic anhydride resin may also be an esterified styrene maleic anhydride copolymer, such as esterified styrene maleic anhydride copolymers SMA1440, SMA17352, SMA2625, SMA3840 and SMA31890 available from Cray Valley. The styrene maleic anhydride resin can be added individually or as a combination to the resin composition of this disclosure.

The polyester resin used herein may be obtained by esterification of an aromatic compound with two carboxylic groups and an aromatic compound with two hydroxyl groups, such as HPC-8000T65 available from DIC Corporation.

The amine curing agent used herein may be any one or a combination of dicyandiamide, diamino diphenyl sulfone, diamino diphenyl methane, diamino diphenyl ether, and diamino diphenyl sulfide.

In one embodiment, the resin composition may optionally further comprise flame retardant, inorganic filler, curing accelerator, solvent, toughening agent, silane coupling agent or a combination thereof.

The flame retardant used herein may be any one or more flame retardants useful for preparing a prepreg, a resin film, a laminate or a printed circuit board; examples include but are not limited to those different from the DOPO-Ar-DOPO, preferably comprising ammonium polyphosphate, hydroquinone bis-(diphenyl phosphate), bisphenol A bis-(diphenylphosphate), tri(2-carboxyethyl) phosphine (TCEP), phosphoric acid tris(chloroisopropyl) ester, trimethyl phosphate (TMP), dimethyl methyl phosphonate (DMMP), resorcinol bis(dixylenyl phosphate) (RDXP, such as commercially available PX-200, PX-201, and PX-202), phosphazene (such as commercially available SPB-100, SPH-100, and SPV-100), melamine polyphosphate, DOPO and its derivatives or resins, DPPO (diphenylphosphine oxide) and its derivatives or resins, melamine cyanurate, tri-hydroxy ethyl isocyanurate, aluminium phosphate (e.g., commercially available OP-930 and OP-935), and a combination thereof.

For example, the flame retardant may be a DPPO compound (e.g., di-DPPO compound), a DOPO resin (e.g., DOPO-HQ, DOPO-NQ, DOPO-PN, and DOPO-BPN), and a DOPO-containing epoxy resin, wherein DOPO-PN is a DOPO-containing phenol novolac compound, and DOPO-BPN may be a DOPO-containing bisphenol novolac compound, such as DOPO-BPAN (DOPO-bisphenol A novolac), DOPO-BPFN (DOPO-bisphenol F novolac) and DOPO-BPSN (DOPO-bisphenol S novolac).

The inorganic filler may be any one or more inorganic fillers used for preparing a resin film, a prepreg, a laminate or a printed circuit board; examples include but are not limited to silica (fused, non-fused, porous or hollow type), aluminum oxide, aluminum hydroxide, magnesium oxide, magnesium hydroxide, calcium carbonate, aluminum nitride, boron nitride, aluminum silicon carbide, silicon carbide, titanium dioxide, zinc oxide, zirconium oxide, mica, boehmite (A100H), calcined talc, talc, silicon nitride, and calcined kaolin. Moreover, the inorganic filler can be spherical, fibrous, plate-like, particulate, sheet-like or whisker-like and can be optionally pre-treated by a silane coupling agent.

The curing accelerator (including curing initiator) may comprise a catalyst, such as a Lewis base or a Lewis acid. The Lewis base may comprise any one or more of imidazole, boron trifluoride-amine complex, ethyltriphenyl phosphonium chloride, 2-methylimidazole (2MI), 2-phenyl-1H-imidazole (2PZ), 2-ethyl-4-methylimidazole (2E4MI), triphenylphosphine (TPP) and 4-dimethylaminopyridine (DMAP). The Lewis acid may comprise metal salt compounds, such as those of manganese, iron, cobalt, nickel, copper and zinc, such as zinc octanoate or cobalt octanoate. The curing accelerator also includes a curing initiator, such as a peroxide capable of producing free radicals, examples of curing initiator including but not limited to dicumyl peroxide, tert-butyl peroxybenzoate, dibenzoyl peroxide (BPO), 2,5-dimethyl-2,5-di(tert-butylperoxy)-3-hexyne (25B), bis(tert-butylperoxyisopropyl) benzene or a combination thereof.

The purpose of adding solvent is to change the solid content of the resin composition and to adjust the viscosity of the resin composition. For example, the solvent may comprise, but not limited to, methanol, ethanol, ethylene glycol monomethyl ether, acetone, butanone (methyl ethyl ketone), methyl isobutyl ketone, cyclohexanone, toluene, xylene, methoxyethyl acetate, ethoxyethyl acetate, propoxyethyl acetate, ethyl acetate, dimethylformamide, dimethylacetamide, propylene glycol methyl ether, or a mixture thereof.

The purpose of adding toughening agent is to improve the toughness of the resin composition. The toughening agent may comprise, but not limited to, rubber resin, carboxyl-terminated butadiene acrylonitrile rubber (CTBN rubber), core-shell rubber, or a combination thereof.

The silane coupling agent may comprise silane (such as but not limited to siloxane) and may be further categorized according to the functional groups into amino silane, epoxide silane, vinyl silane, acrylate silane, methacrylate silane, hydroxyl silane, isocyanate silane, methacryloxy silane and acryloxy silane.

Article Made from Resin Composition

The resin composition may be processed by various methods into different articles, such as those suitable for use as components in electronic products, including but not limited to a resin film, a prepreg, a laminate, and a printed circuit board.

The article made from the resin composition may be a resin film prepared by heating and baking to cure the resin composition. The resin composition may be selectively coated on a polyethylene terephthalate film (PET film), a polyimide film (PI film), or a copper foil, followed by heating and baking to semi-cure the resin composition to form the resin film.

The article made from the resin composition may be a prepreg, which comprises a reinforcement material and a layered structure disposed thereon. The layered structure is formed by heating the resin composition at a high temperature to the B-stage. Suitable baking temperature for making the prepreg may be 80° C. to 200° C. The reinforcement material may be any one of a fiber material, woven fabric, and non-woven fabric, and the woven fabric preferably comprises fiberglass fabrics. Types of fiberglass fabrics are not particularly limited and may be any commercial fiberglass fabric used for various printed circuit boards, such as E-glass fabric, D-glass fabric, S-glass fabric, T-glass fabric, L-glass fabric or Q-glass fabric, wherein the fiber may comprise yarns and rovings, in spread form or standard form. Non-woven fabric preferably comprises liquid crystal polymer non-woven fabric, such as polyester non-woven fabric, polyurethane non-woven fabric and so on, but not limited thereto. Woven fabric may also comprise liquid crystal polymer woven fabric, such as polyester woven fabric, polyurethane woven fabric and so on, but not limited thereto. The reinforcement material may increase the mechanical strength of the prepreg. In one preferred embodiment, the reinforcement material can be optionally pre-treated by a silane coupling agent. The prepreg may be further heated and cured to the C-stage to form an insulation layer.

The article made from the resin composition may be a laminate, which comprises two metal foils and an insulation layer disposed between the metal foils, wherein the insulation layer is made by curing the aforesaid resin composition at high temperature and high pressure to the C-stage, a suitable curing temperature being for example between 150° C. and 220° C. and preferably between 200° C. and 210° C. and a suitable curing time being 90 to 180 minutes and preferably 120 to 150 minutes. The insulation layer may be formed by curing the aforesaid prepreg or resin film to the C-stage. The metal foil may comprise copper, aluminum, nickel, platinum, silver, gold or alloy thereof, such as a copper foil.

Preferably, the laminate is a copper-clad laminate (CCL).

The laminate may be further processed by trace formation processes to provide a circuit board, such as a printed circuit board.

EXAMPLES

Raw materials below were used to prepare the resin compositions of various Examples and Comparative Examples of the present disclosure according to the amount listed in Table 1 to Table 5 and further fabricated to prepare test samples.

DVB: divinylbenzene, available from Merck.
MMA: methyl methacrylate, tradename M55909, available from Merck.
TMPTMA: trimethylolpropane trimethacrylate, tradename 246840, available from Merck.
TAIC: triallyl isocyanurate, available from Kingyorker Enterprise Co., Ltd.
Ethylvinylbenzene: commercially available.
Di-DOPO: di-DOPO phosphorus-containing high melting point (above 200° C.) flame retardant, as shown below, synthesized by reference to Chinese Patent Application Publication CN105936745A.

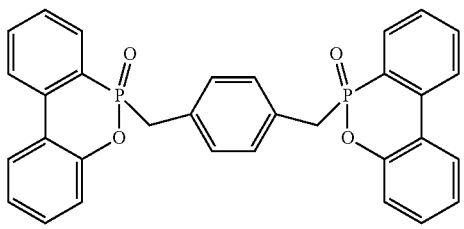 [SMILES: O=P1(Cc2ccc(CP3(=O)Oc4ccccc4-c4ccccc43)cc2)Oc2ccccc2-c2ccccc21]

SPB-100: phosphazene compound, available from Otsuka Chemical Co., Ltd.

PX-200: resorcinol bis[di(2,6-dimethylphenyl)phosphate], available from Daihachi Chemical Industry Co., Ltd.

BMI-2300: polyphenylmethane maleimide, available from Daiwakasei Industry Co., Ltd.

SA-9000: methacrylate-terminated polyphenylene ether resin, available from Sabic.

SC-2500 SVJ: spherical silica, available from Admatechs.

DCP: dicumyl peroxide, available from NOF Corporation.

MEK: methyl ethyl ketone, source not limited.

Toluene: available from Chambeco Group.

25B: peroxide, 2,5-dimethyl-2,5-di(t-butylperoxy)-3-hexyne, available from NOF Corporation.

TABLE 1

Resin compositions of Examples (in part by weight)

| Component | | E1 | E2 | E3 | E4 | E5 | E6 |
|---|---|---|---|---|---|---|---|
| DVB Prepolymer 1 | DVB:MMA:TAIC = 20:10:70 | | | | | 30 | |
| DVB Prepolymer 2 | DVB:MMA:TAIC = 50:20:30 | 10 | 30 | 60 | | | 30 |
| DVB Prepolymer 3 | DVB:MMA:TAIC = 10:40:50 | | | | | 30 | |
| DVB Prepolymer 4 | DVB:TMPTMA:TAIC = 50:20:30 | | | | | | |
| phosphorus-containing flame retardant | Di-DOPO | 30 | 30 | 30 | 30 | 30 | 20 |
| maleimide resin | BMI-2300 | 30 | 30 | 30 | 30 | 30 | 30 |
| polyphenylene ether resin | SA-9000 | 30 | 30 | 30 | 30 | 30 | 30 |
| inorganic filler | SC-2500 SVJ | 80 | 80 | 80 | 80 | 80 | 80 |
| curing accelerator | DCP | 0.03 | 0.03 | 0.03 | 0.03 | 0.03 | 0.03 |
| solvent | MEK | 30 | 30 | 30 | 30 | 30 | 30 |
| | Toluene | 30 | 30 | 30 | 30 | 30 | 30 |

TABLE 2

Resin compositions of Examples (in part by weight)

| Component | | E7 | E8 | E9 | E10 | E11 | E12 |
|---|---|---|---|---|---|---|---|
| DVB Prepolymer 1 | DVB:MMA:TAIC = 20:10:70 | | | | | | |
| DVB Prepolymer 2 | DVB:MMA:TAIC = 50:20:30 | 30 | | 30 | 30 | 5 | 70 |
| DVB Prepolymer 3 | DVB:MMA:TAIC = 10:40:50 | | | | | | |
| DVB Prepolymer 4 | DVB:TMPTMA:TAIC = 50:20:30 | | 30 | | | | |
| phosphorus-containing flame retardant | Di-DOPO | 60 | 30 | 10 | 70 | 30 | 30 |
| maleimide resin | BMI-2300 | 30 | 30 | 30 | 30 | 30 | 30 |
| polyphenylene ether resin | SA-9000 | 30 | 30 | 30 | 30 | 30 | 30 |
| inorganic filler | SC-2500 SVJ | 80 | 80 | 80 | 80 | 80 | 80 |
| curing accelerator | DCP | 0.03 | 0.03 | 0.03 | 0.03 | 0.03 | 0.03 |
| solvent | MEK | 30 | 30 | 30 | 30 | 30 | 30 |
| | Toluene | 30 | 30 | 30 | 30 | 30 | 30 |

TABLE 3

Resin compositions of Examples (in part by weight)

| Component | | E13 | E14 | E15 | E16 | E17 | E18 |
|---|---|---|---|---|---|---|---|
| DVB Prepolymer 5 | DVB:MMA:TAIC = 5:35:60 | 30 | | | | | |
| DVB Prepolymer 6 | DVB:MMA:TAIC = 60:10:30 | | 30 | | | | |

TABLE 3-continued

Resin compositions of Examples (in part by weight)

| Component | | E13 | E14 | E15 | E16 | E17 | E18 |
|---|---|---|---|---|---|---|---|
| DVB Prepolymer 7 | DVB:MMA:TAIC = 25:50:25 | | | 30 | | | |
| DVB Prepolymer 8 | DVB:MMA:TAIC = 35:5:60 | | | | 30 | | |
| DVB Prepolymer 9 | DVB:MMA:TAIC = 40:35:25 | | | | | 30 | |
| DVB Prepolymer 10 | DVB:MMA:TAIC = 15:10:75 | | | | | | 30 |
| phosphorus-containing flame retardant | Di-DOPO | 30 | 30 | 30 | 30 | 30 | 30 |
| maleimide resin | BMI-2300 | 30 | 30 | 30 | 30 | 30 | 30 |
| polyphenylene ether resin | SA-9000 | 30 | 30 | 30 | 30 | 30 | 30 |
| inorganic filler | SC-2500 SVJ | 80 | 80 | 80 | 80 | 80 | 80 |
| curing accelerator | DCP | 0.03 | 0.03 | 0.03 | 0.03 | 0.03 | 0.03 |
| solvent | MEK | 30 | 30 | 30 | 30 | 30 | 30 |
| | Toluene | 30 | 30 | 30 | 30 | 30 | 30 |

TABLE 4

Resin compositions of Comparative Examples (in part by weight)

| Component | | C1 | C2 | C3 | C4 | C5 | C6 |
|---|---|---|---|---|---|---|---|
| DVB Prepolymer 2 | DVB:MMA:TAIC = 50:20:30 | | | | | | |
| divinylbenzene | DVB | 15 | | | 15 | | 30 |
| acrylate | MMA | 6 | | 6 | | | |
| triallyl isocyanurate | TAIC | 9 | 9 | | | | |
| DVB:MMA (5:2) Prepolymer | | | 21 | | | | |
| DVB:TAIC (5:3) Prepolymer | | | | 24 | | | |
| MMA:TAIC (2:3) Prepolymer | | | | | 15 | | |
| DVB:MMA:ethylvinylbenzene Prepolymer = 50:20:30 | | | | | | 30 | |
| phosphorus-containing flame retardant | Di-DOPO | 30 | 30 | 30 | 30 | 30 | 30 |
| | PX-200 | | | | | | |
| | SPB-100 | | | | | | |
| maleimide resin | BMI-2300 | 30 | 30 | 30 | 30 | 30 | 30 |
| polyphenylene ether resin | SA-9000 | 30 | 30 | 30 | 30 | 30 | 30 |
| inorganic filler | SC-2500 SVJ | 80 | 80 | 80 | 80 | 80 | 80 |
| curing accelerator | DCP | 0.03 | 0.03 | 0.03 | 0.03 | 0.03 | 0.03 |
| solvent | MEK | 30 | 30 | 30 | 30 | 30 | 30 |
| | Toluene | 30 | 30 | 30 | 30 | 30 | 30 |

TABLE 5

Resin compositions of Comparative Examples (in part by weight)

| Component | | C7 | C8 | C9 | C10 | C11 | C12 |
|---|---|---|---|---|---|---|---|
| DVB Prepolymer 2 | DVB:MMA:TAIC = 50:20:30 | | | 30 | | 30 | |
| divinylbenzene | DVB | | | | | | |
| acrylate | MMA | 30 | | | | | |
| triallyl isocyanurate | TAIC | | 30 | | | | |
| DVB:MMA (5:2) Prepolymer | | | | | | 30 | 30 |
| DVB:TAIC (5:3) Prepolymer | | | | | | | |
| MMA:TAIC (2:3) Prepolymer | | | | | | | |
| DVB:MMA:ethylvinylbenzene Prepolymer = 50:20:30 | | | | | | | |
| phosphorus-containing flame retardant | Di-DOPO | 30 | 30 | | | 30 | |
| | PX-200 | | | 30 | | | 30 |
| | SPB-100 | | | | 30 | | |
| maleimide resin | BMI-2300 | 30 | 30 | 30 | 30 | 30 | 30 |
| polyphenylene ether resin | SA-9000 | 30 | 30 | 30 | 30 | 30 | 30 |
| inorganic filler | SC-2500 SVJ | 80 | 80 | 80 | 80 | 80 | 80 |

TABLE 5-continued

Resin compositions of Comparative Examples (in part by weight)

| Component | | C7 | C8 | C9 | C10 | C11 | C12 |
|---|---|---|---|---|---|---|---|
| curing accelerator | DCP | 0.03 | 0.03 | 0.03 | 0.03 | 0.03 | 0.03 |
| solvent | MEK | 30 | 30 | 30 | 30 | 30 | 30 |
|  | Toluene | 30 | 30 | 30 | 30 | 30 | 30 |

Preparation of DVB Prepolymer 1:

To 20 parts by weight of a divinylbenzene compound (DVB), 10 parts by weight of a methyl methacrylate resin (MMA, M55909) and 70 parts by weight of a triallyl isocyanurate resin (TAIC) were added, followed by adding 0.1-1.0 part by weight a peroxide 2,5-dimethyl-2,5-di(t-butylperoxy)-3-hexyne (25B) as the initiator, and the reaction was performed under continuous stirring at 60-120° C. for 1-4 hours; after the reaction was over, the solution was filtrated and purified and then cooled to obtain the DVB Prepolymer 1 in liquid state.

Preparation of DVB Prepolymer 2:

50 parts by weight of a divinylbenzene compound (DVB), 20 parts by weight of a methyl methacrylate resin (MMA, M55909) and 30 parts by weight of a triallyl isocyanurate resin (TAIC) were used to prepare the DVB Prepolymer 2 following the process described above for the DVB Prepolymer 1.

Preparation of DVB Prepolymer 3:

10 parts by weight of a divinylbenzene compound (DVB), 40 parts by weight of a methyl methacrylate resin (MMA, M55909) and 50 parts by weight of a triallyl isocyanurate resin (TAIC) were used to prepare the DVB Prepolymer 3 following the process described above for the DVB Prepolymer 1.

Preparation of DVB Prepolymer 4:

50 parts by weight of a divinylbenzene compound (DVB), 20 parts by weight of a trimethylolpropane trimethacrylate resin (TMPTMA) and 30 parts by weight of a triallyl isocyanurate resin (TAIC) were used to prepare the DVB Prepolymer 4 following the process described above for the DVB Prepolymer 1.

Preparation of DVB Prepolymer 5:

5 parts by weight of a divinylbenzene compound (DVB), 35 parts by weight of a methyl methacrylate resin (MMA, M55909) and 60 parts by weight of a triallyl isocyanurate resin (TAIC) were used to prepare the DVB Prepolymer 5 following the process described above for the DVB Prepolymer 1.

Preparation of DVB Prepolymer 6:

60 parts by weight of a divinylbenzene compound (DVB), 10 parts by weight of a methyl methacrylate resin (MMA, M55909) and 30 parts by weight of a triallyl isocyanurate resin (TAIC) were used to prepare the DVB Prepolymer 6 following the process described above for the DVB Prepolymer 1.

Preparation of DVB Prepolymer 7:

25 parts by weight of a divinylbenzene compound (DVB), 50 parts by weight of a methyl methacrylate resin (MMA, M55909) and 25 parts by weight of a triallyl isocyanurate resin (TAIC) were used to prepare the DVB Prepolymer 7 following the process described above for the DVB Prepolymer 1.

Preparation of DVB Prepolymer 8:

35 parts by weight of a divinylbenzene compound (DVB), 5 parts by weight of a methyl methacrylate resin (MMA, M55909) and 60 parts by weight of a triallyl isocyanurate resin (TAIC) were used to prepare the DVB Prepolymer 8 following the process described above for the DVB Prepolymer 1.

Preparation of DVB Prepolymer 9:

40 parts by weight of a divinylbenzene compound (DVB), 35 parts by weight of a methyl methacrylate resin (MMA, M55909) and 25 parts by weight of a triallyl isocyanurate resin (TAIC) were used to prepare the DVB Prepolymer 9 following the process described above for the DVB Prepolymer 1.

Preparation of DVB Prepolymer 10:

15 parts by weight of a divinylbenzene compound (DVB), 10 parts by weight of a methyl methacrylate resin (MMA, M55909) and 75 parts by weight of a triallyl isocyanurate resin (TAIC) were used to prepare the DVB Prepolymer 10 following the process described above for the DVB Prepolymer 1.

Preparation of DVB:MMA (5:2) Prepolymer, DVB:TAIC (5:3) Prepolymer and MMA:TAIC (2:3) Prepolymer:

Any two components were selected from DVB, MMA and TAIC to prepare different prepolymers via prepolymerization at predetermined ratios (e.g., 5:2, 5:3 or 2:3) following the process described above for the DVB Prepolymer 1.

Preparation of prepolymer of divinylbenzene, methyl methacrylate and ethylvinylbenzene:

50 parts by weight of a divinylbenzene compound (DVB), 20 parts by weight of a methyl methacrylate resin (MMA, M55909) and 30 parts by weight of an ethylvinylbenzene compound were used to prepare the prepolymer of divinylbenzene, methyl methacrylate and ethylvinylbenzene following the process described above for the DVB Prepolymer 1.

Preparation of Varnish

Components of the resin composition from each Example (abbreviated as E1, E2, etc.) or Comparative Example (abbreviated as C1, C2, etc.) were placed into a stirrer (e.g., batch mixer) according to the amounts listed in the Tables above for stirring and well-mixing to form a resin varnish.

Preparation of Resin Composition E1 (Each Component Having a Solid Content of 100%)

To 10 parts by weight of the DVB Prepolymer 1, 30 parts by weight of a maleimide resin (BMI-2300), 30 parts by weight of a methacrylate-terminated polyphenylene ether resin (SA-9000), 30 parts by weight of toluene and 30 parts by weight of methyl ethyl ketone were added, and the solution was mixed and stirred to fully dissolve the solid ingredients to form a homogeneous liquid state. Then 30 parts by weight of the Di-DOPO phosphorus-containing flame retardant and 80 parts by weight of spherical silica (SC-2500 SVJ) were added and well dispersed, followed by adding 0.03 part by weight of dicumyl peroxide (DCP) and stirring for 0.5 hour to obtain the Resin Composition E1.

According to the components and amounts listed in Table 1 to Table 5 above, resin compositions of Examples E2 to E18 and Comparative Examples Ca to C12 containing the prepolymer (each component having a solid content of 100%) were prepared following the preparation process of Resin Composition E1.

Resin compositions from Table 1 to Table 5 were used to make samples (specimens) as described below and tested under conditions specified below.

1. Prepreg

Resin composition from each Example or Comparative Example was loaded into an impregnation tank for impregnating fiberglass fabric (2116 E-glass fiber fabric, available from Asahi Fiber Glass Co., Ltd.), such that the resin composition was adhered on the fiberglass fabric, followed by heating at 120-170° C. to the B-Stage to obtain a prepreg with a resin content of about 55%.

2. Copper-Clad Laminate (Obtained by Laminating Eight Prepregs)

Two 18 μm reverse treatment copper foils (RTFs) and eight prepregs made from each resin composition (using 2116 E-glass fiber fabrics) were prepared. Each prepreg has a resin content of about 55%. A copper foil, eight prepregs and a copper foil were superimposed in such order and then subject to a vacuum condition for lamination at 200° C. for 2.5 hours to form each copper-clad laminate. Insulation layers were formed by curing (C-stage) eight sheets of superimposed prepreg between the two copper foils, and the resin content of the insulation layers was about 55%.

3. Copper-Free Laminate (Obtained by Laminating Eight Prepregs)

Each copper-clad laminate was etched to remove the two copper foils to obtain a copper-free laminate made from laminating eight prepregs, and each copper-free laminate had a resin content of about 55%.

4. Copper-Clad Laminate (Obtained by Laminating Two Prepregs)

Resin composition from each Example or Comparative Example was loaded into an impregnation tank for impregnating fiberglass fabric (1080 E-glass fiber fabric, available from Asahi Fiber Glass Co., Ltd.), such that the resin composition was adhered on the fiberglass fabric, followed by heating at 120-170° C. to the B-Stage to obtain a prepreg with a resin content of about 70%.

Two 18 μm reverse treatment copper foils (RTFs) and two prepregs made from each resin composition (using 1080 E-glass fiber fabrics) were prepared. Each prepreg has a resin content of about 70%. A copper foil, two prepregs and a copper foil were superimposed in such order and then subject to a vacuum condition for lamination at 200° C. for 2.5 hours to form each copper-clad laminate. Insulation layers were formed by curing (C-stage) two sheets of superimposed prepreg between the two copper foils, and the resin content of the insulation layers was about 70%.

5. Copper-Free Laminate (Obtained by Laminating Two Prepregs)

Each copper-clad laminate was etched to remove the two copper foils to obtain a copper-free laminate made from laminating two prepregs, and each copper-free laminate had a resin content of about 70%.

Each sample was analyzed as described below.

1. Glass Transition Temperature (Tg)

The copper-free laminate (obtained by laminating eight prepregs) was subject to glass transition temperature measurement. An dynamic mechanical analysis (DMA) was performed by reference to the method described in IPC-TM-650 2.4.24.4, during which each sample was heated from 35° C. to 300° C. at a heating rate of 2° C./minute and then subject to the measurement of glass transition temperature (DMA Tg, in ° C.); a higher glass transition temperature is more preferred.

A copper-free laminate sample (obtained by laminating eight prepregs) was subject to the glass transition temperature measurement. A thermal mechanical analysis (TMA) was performed by reference to the method described in IPC-TM-650 2.4.24.5, during which each sample was heated from 35° C. to 300° C. at a heating rate of 10° C./minute and then subject to the measurement of glass transition temperature (TMA Tg, in ° C.); a higher glass transition temperature is more preferred.

2. Ratio of Thermal Expansion (Z-Axis)

A copper-free laminate sample (obtained by laminating eight prepregs) was subject to thermal mechanical analysis (TMA) during the ratio of thermal expansion (i.e., ratio of dimensional change) measurement. Each sample was heated from 35° C. to 300° C. at a heating rate of 10° C./minute and then subject to the measurement of ratio of thermal expansion (%) in Z-axis in a temperature range of 50-260° C. by reference to the method described in IPC-TM-650 2.4.24.5; a lower ratio of thermal expansion is more preferred.

3. Copper Foil Peeling Strength (Peel Strength, P/S)

A copper-containing laminate (obtained by laminating eight prepregs) was cut into a rectangular specimen with a width of 24 mm and a length of greater than 60 mm, which was then etched to remove surface copper foil and leave a rectangular copper foil with a width of 3.18 mm and a length of greater than 60 mm. The specimen was tested by using a tensile strength tester by reference to IPC-TM-650 2.4.8 at ambient temperature (about 25° C.) to measure the force (1b/in) required to pull off the copper foil from the laminate surface; a higher peel strength is more preferred, and a difference in peel strength of greater than or equal to 0.1 lb/in represents a significant difference.

4. Thermal Resistance after Moisture Absorption (PCT)

A copper-free laminate sample (obtained by laminating eight prepregs) was subject to pressure cooking test (PCT) by reference to IPC-TM-650 2.6.16.1 and 5 hours of moisture absorption (testing temperature of 121° C., relative humidity of 100%), and then by reference to IPC-TM-650 2.4.23, the sample after moisture absorption was immersed into a 288° C. solder bath for 20 seconds, removed and then inspected for the presence of delamination, which represents fail, such as whether interlayer delamination or blistering occurs between insulation layers. Interlayer delamination or blistering may occur between any layers of the laminate.

5. T300 Thermal Resistance

A copper-containing laminate sample (obtained by laminating eight prepregs) was used in the T300 thermal resistance test. At a constant temperature of 300° C., a thermal mechanical analysis (TMA) was performed by reference to IPC-TM-650 2.4.24.1 to test each sample and record the time to blistering or delamination of each sample; if no blistering or delamination was observed after 70 minutes of testing, a designation ">70" was given.

6. Modulus Decay Ratio

The storage modulus (in Gpa) at 50° C. and 250° C. of a copper-free laminate sample (obtained by laminating eight prepregs) was measured by a DMA instrument by reference to IPC-TM-650 2.4.24.4. Modulus decay ratio was calculated by the formula: ((storage modulus at 50° C.−storage modulus at 250° C.)/storage modulus at 50° C.)*100%.

7. Dielectric Constant (Dk) and Dissipation Factor (Df)

In dielectric constant and dissipation factor measurements, a copper-free laminate sample (obtained by laminating two prepregs) was tested by using a microwave dielectrometer available from AET Corp. by reference to JIS C2565 at 10 GHz for analyzing each sample. Lower dielectric constant and lower dissipation factor represent better dielectric properties of the sample.

Under a 10 GHz frequency, for a Dk value of less than 3.60 and a Df value of less than 0.005, a difference in Dk value of greater than or equal to 0.05 represents substantial difference (i.e., significant technical difficulty) in dielectric constant of different laminates, and a difference in Dk value of less than 0.05 represents no substantial difference in dielectric constant of different laminates; a difference in Df value of less than 0.0002 represents no substantial difference in dissipation factor of different laminates, and a difference in Df value of greater than or equal to 0.0002 represents a substantial difference (i.e., significant technical difficulty) in dissipation factor of different laminates.

8. Branch-Like Pattern on Laminate Surface

Figure 2:
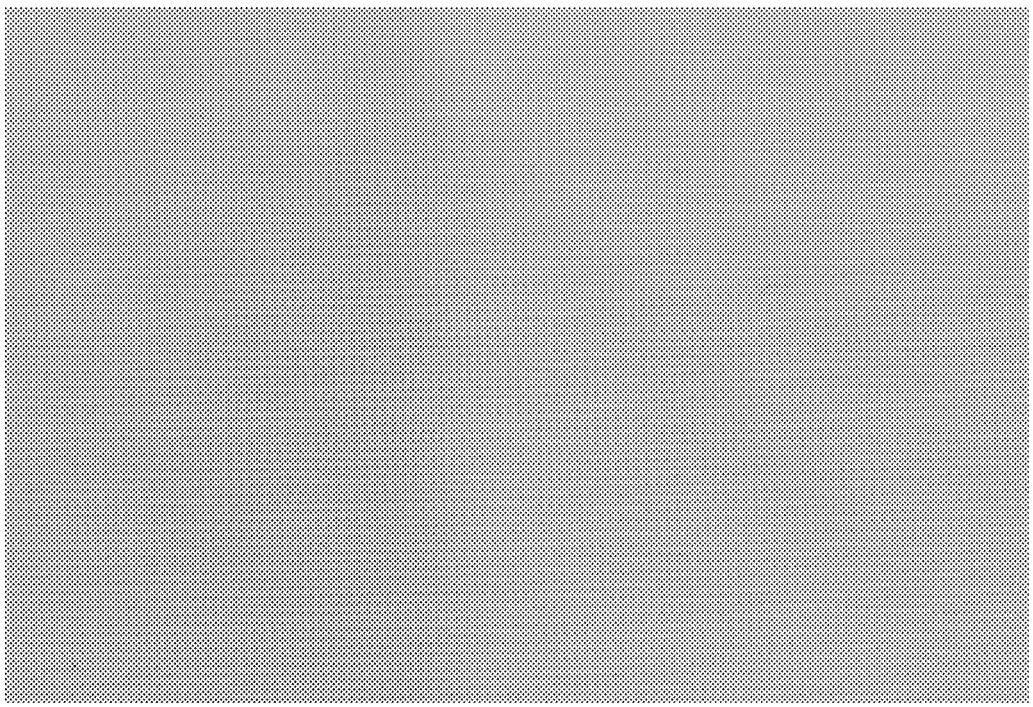
FIG. 2 illustrates a copper-free laminate having a surface without branch-like pattern.

During the preparation of the copper-clad laminate (obtained by laminating eight prepregs), a copper foil, eight prepregs and a copper foil were superimposed in such order and then subject to a vacuum condition for lamination at 200° C. for 2.5 hours to form each copper-clad laminate, which was then subject to an etching process to remove the copper foils on both sides to obtain the copper-free laminate. The surface of the insulation layer of the copper-free laminate was examined with naked eyes to determine whether branch-like pattern was formed at the edge, which represents poor compatibility of components in the resin composition or high flowability variation that causes inhomogeneity. Presence of branch-like pattern of a laminate will cause several drawbacks including inconsistent properties (poor reliability) of circuit boards made therefrom and significantly lowered yield, such as poor dielectric properties, poor thermal resistance, inconsistent thermal expansion or poor interlayer adhesion. At least one branch-like pattern on the surface of a copper-free laminate is designated as "serious", and absence of branch-like pattern on the surface a copper-free laminate is designated as "none". FIG. 1 illustrates a copper-free laminate having a surface with branch-like pattern, and FIG. 2 illustrates a copper-free laminate having a surface without branch-like pattern.

9. Flame Resistance

A copper-free laminate sample (obtained by laminating eight prepregs) was used in the flame resistance test. The flame resistance test was performed in accordance with the UL94 rating, and the results were represented by V-0, V-1, or V-2, wherein V-0 indicates a superior flame resistance to V-1, and V-1 indicates a superior flame resistance to V-2.

10. Volatility

During the baking process of prepregs, white mist appears if triallyl isocyanurate is volatilized. If divinylbenzene is volatilized, the gelation time of prepregs (PG) will be longer than the gelation time of varnishes (SG), i.e., PG>SG.

The gelation time of varnishes was measured as follows: 0.2 gram of a varnish was first placed at the center of a 171° C. hot plate for 60 seconds and then smeared as a circle with a diameter of about 1 cm; after the varnish clotted and could be pulled up from the hot plate, the duration was recorded and designated as SG (in second).

The gelation time of prepregs was measured as follows: a prepreg was rubbed, and 0.2 gram of powder passing through a 60-mesh screen was collected and placed at the center of a 171° C. hot plate for 20 seconds and then smeared as a circle with a diameter of about 1 cm; after the varnish clotted and could be pulled up from the hot plate, the duration was recorded and designated as PG (in second).

Property Descriptions

The resin compositions and various articles made therefrom according to the present disclosure, such as a resin film, a prepreg, a laminate, and a printed circuit board, may achieve one, more or all of the following desirable properties.

(1) Absence of Branch-Like Pattern on Copper-Free Laminate Surface:

The surface of a copper-free laminate is smooth. Presence of branch-like pattern on the surface of a copper-free laminate will cause poor reliability of circuit boards made therefrom and significantly lower the yield.

(2) Low Ratio of Thermal Expansion:

The ratio of thermal expansion in Z-axis (50-260° C.) measured from a sample is less than 1.30%, preferably less than or equal to 1.25%, 1.20%, 1.10%, 1.00%, 0.90%, or 0.80%, such as between 0.80% and 1.25%, more preferably between 0.88% and 1.03%. In general, high ratio of thermal expansion in Z-axis indicates high ratio of dimensional change, and copper-clad laminates with high ratio of dimensional change may result in reliability problems such as delamination during printed circuit board processing. In the present technical field, lower ratio of thermal expansion is more preferred, and a difference in ratio of thermal expansion of greater than or equal to 0.1% represents a significant difference.

(3) High Glass Transition Temperature:

Samples have a DMA Tg of greater than or equal to 240° C., 245° C., 250° C., 255° C., or 260° C., such as between 240° C. and 260° C.

In addition, samples have a TMA Tg of greater than or equal to 240° C., preferably greater than or equal to 240° C., 250° C., 260° C., 265° C., 270° C., or 275° C., such as between 240° C. and 275° C., preferably between 260° C. and 274° C.

DMA and TMA methods measure glass transition temperature of a material according to different theories. Different physical properties of a material lead to different temperature points of abrupt change and therefore correspond to different glass transition temperatures. For a high Tg material, the DMA Tg is generally higher than the TMA Tg because the TMA method determines the glass transition temperature according to the change in Z-axis coefficient of thermal expansion of a material, while the DMA method determines the glass transition temperature according to the change in elastic modulus of a material. From the perspective of thermal molecular motion, when the temperature reaches the glass transition point, the free volume as well as the ratio of volume expansion of a material begin to increase, during which the coefficient of expansion measured by the TMA method begins to change. When the free volume is increased to a certain extent, the polymer segments begin to move and the material enters the high elasticity state such that the modulus begins to change. In the present technical field, higher glass transition temperature is more preferred, and a difference in glass transition temperature of greater than or equal to 5° C. represents a significant difference. A material having a TMA Tg of higher than its DMA Tg indicates that the material has a low ratio of thermal expansion at a temperature below the glass transition temperature, such that laminates made therefrom have low dimensional change and are more stable during PCB processing.

(4) High Copper Foil Peeling Strength:

The peel strength measured from a sample is greater than or equal to 3.0 lb/in, preferably greater than or equal to 3.5 lb/in, 3.6 lb/in, 3.7 lb/in, 3.8 lb/in, 3.9 lb/in, 4.0 lb/in or 4.1 lb/in, such as between 3.5 lb/in and 4.1 lb/in. In the present technical field, a higher copper foil peeling strength is more preferred, and a difference in copper foil peeling strength of greater than or equal to 0.1 lb/in represents a significant difference.

TABLE 6

Test results of resin compositions of Examples

| Property | Test item (method) | Unit | E1 | E2 | E3 | E4 | E5 | E6 |
|---|---|---|---|---|---|---|---|---|
| Glass transition temperature | Tg (DMA) | °C. | 245 | 255 | 255 | 250 | 250 | 251 |
| | Tg (TMA) | °C. | 260 | 272 | 274 | 265 | 268 | 270 |
| Ratio of thermal expansion | (TMA, 50-260° C., Z-axis) | % | 0.98 | 0.90 | 0.95 | 1.00 | 0.90 | 0.90 |
| Copper foil peeling strength (P/S) | RTF H oz, tensile strength tester | lb/in | 3.90 | 3.80 | 3.60 | 4.00 | 4.00 | 3.90 |
| PCT | 5 hr, dip 288° C., 20 s | none | pass | pass | pass | pass | pass | pass |
| T300° C. thermal resistance | T300 (TMA) | minute | >70 | >70 | >70 | >70 | >70 | >70 |
| Modulus decay ratio | 50-250° C. (DMA) | % | 28 | 25 | 25 | 28 | 28 | 27 |
| Dielectric constant | Dk@10 GHz | none | 3.55 | 3.50 | 3.47 | 3.55 | 3.50 | 3.50 |
| Dissipation factor | Df@10 GHz | none | 0.0046 | 0.0044 | 0.0044 | 0.0046 | 0.0044 | 0.0045 |
| Branch-like pattern on laminate surface | visual inspection | none | none | none | none | none | none | none |
| Flame retardancy | UL 94 | none | V-0 | V-0 | V-0 | V-0 | V-0 | V-0 |

TABLE 7

Test results of resin compositions of Examples

| Property | Test item (method) | Unit | E7 | E8 | E9 | E10 | E11 | E12 |
|---|---|---|---|---|---|---|---|---|
| Glass transition temperature | Tg (DMA) | °C. | 252 | 260 | 250 | 250 | 245 | 255 |
| | Tg (TMA) | °C. | 270 | 272 | 240 | 270 | 240 | 270 |
| Ratio of thermal expansion | (TMA, 50-260° C., Z-axis) | % | 1.03 | 0.88 | 0.95 | 1.02 | 1.25 | 0.98 |
| Copper foil peeling strength (P/S) | RTF H oz, tensile strength tester | lb/in | 3.50 | 3.80 | 3.60 | 3.00 | 3.50 | 3.10 |
| PCT | 5 hr, dip 288° C., 20 s | none | pass | pass | pass | fail | pass | pass |
| T300° C. thermal resistance | T300 (TMA) | minute | >70 | >70 | >70 | 45 | 30 | >70 |
| Modulus decay ratio | 50-250° C. (DMA) | % | 32 | 25 | 33 | 38 | 40 | 28 |
| Dielectric constant | Dk@10 GHz | none | 3.55 | 3.51 | 3.47 | 3.50 | 3.55 | 3.50 |
| Dissipation factor | Df@10 GHz | none | 0.0045 | 0.0045 | 0.0050 | 0.0045 | 0.0050 | 0.0044 |
| Branch-like pattern on laminate surface | visual inspection | none | none | none | none | none | none | none |
| Flame retardancy | UL 94 | none | V-0 | V-0 | V-1 | V-0 | V-0 | V-0 |

TABLE 8

Test results of resin compositions of Examples

| Property | Test item (method) | Unit | E13 | E14 | E15 | E16 | E17 | E18 |
|---|---|---|---|---|---|---|---|---|
| Glass transition temperature | Tg (DMA) | °C. | 249 | 250 | 240 | 248 | 252 | 255 |
| | Tg (TMA) | °C. | 265 | 255 | 245 | 252 | 255 | 266 |
| Ratio of thermal expansion | (TMA, 50-260° C., Z-axis) | % | 0.95 | 1.10 | 1.25 | 1.05 | 1.20 | 1.00 |
| Copper foil peeling strength (P/S) | RTF H oz, tensile strength tester | lb/in | 4.05 | 3.60 | 4.10 | 3.60 | 3.60 | 4.02 |
| PCT | 5 hr, dip 288° C., 20 s | none | pass | fail | fail | fail | fail | pass |
| T300° C. thermal resistance | T300 (TMA) | minute | >70 | 60 | 50 | 60 | >70 | >70 |
| Modulus decay ratio | 50-250° C. (DMA) | % | 31 | 35 | 42 | 38 | 33 | 28 |
| Dielectric constant | Dk@10 GHz | none | 3.65 | 3.50 | 3.58 | 3.50 | 3.50 | 3.65 |
| Dissipation factor | Df@10 GHz | none | 0.0053 | 0.0043 | 0.0049 | 0.0044 | 0.0044 | 0.0050 |
| Branch-like pattern on laminate surface | visual inspection | none | none | none | none | none | none | none |
| Flame retardancy | UL 94 | none | V-0 | V-0 | V-0 | V-0 | V-0 | V-0 |

TABLE 9

Test results of resin compositions of Comparative Examples

| Property | Test item (method) | Unit | C1 | C2 | C3 | C4 | C5 | C6 |
|---|---|---|---|---|---|---|---|---|
| Glass transition temperature | Tg (DMA) | ° C. | 220 | 251 | 250 | 240 | 220 | 230 |
| | Tg (TMA) | ° C. | 210 | 250 | 230 | 230 | 200 | 210 |
| Ratio of thermal expansion | (TMA, 50-260° C., Z-axis) | % | 1.70 | 1.30 | 1.60 | 1.40 | 1.80 | 1.80 |
| Copper foil peeling strength (P/S) | RTF H oz, tensile strength tester | lb/in | 3.90 | 3.30 | 2.80 | 3.90 | 2.40 | 2.50 |
| PCT | 5 hr, dip 288° C., 20 s | none | fail | pass | fail | fail | fail | fail |
| T300° C. thermal resistance | T300 (TMA) | minute | 30 | >70 | 50 | 40 | 10 | 40 |
| Modulus decay ratio | 50-250° C. (DMA) | % | 50 | 40 | 45 | 43 | 45 | 48 |
| Dielectric constant | Dk@10 GHz | none | 3.60 | 3.50 | 3.50 | 3.60 | 3.45 | 3.65 |
| Dissipation factor | Df@10 GHz | none | 0.0054 | 0.0046 | 0.0045 | 0.0050 | 0.0042 | 0.0054 |
| Branch-like pattern on laminate surface | visual inspection | none | serious | serious | none | none | none | none |
| Flame retardancy | UL 94 | none | V-0 | V-0 | V-0 | V-0 | V-0 | V-0 |

TABLE 10

Test results of resin compositions of Comparative Examples

| Property | Test item (method) | Unit | C7 | C8 | C9 | C10 | C11 | C12 |
|---|---|---|---|---|---|---|---|---|
| Glass transition temperature | Tg (DMA) | ° C. | 234 | 250 | 210 | 230 | 230 | 205 |
| | Tg (TMA) | ° C. | 215 | 230 | 180 | 210 | 220 | 175 |
| Ratio of thermal expansion | (TMA, 50-260° C., Z-axis) | % | 1.82 | 1.50 | 2.20 | 1.80 | 1.60 | 2.40 |
| Copper foil peeling strength (P/S) | RTF H oz, tensile strength tester | lb/in | 3.80 | 3.50 | 3.60 | 3.70 | 3.10 | 3.40 |
| PCT | 5 hr, dip 288° C., 20 s | none | fail | fail | fail | pass | fail | fail |
| T300° C. thermal resistance | T300 (TMA) | minute | 10 | 40 | 20 | 40 | 50 | 20 |
| Modulus decay ratio | 50-250° C. (DMA) | % | 50 | 40 | 55 | 47 | 40 | 65 |
| Dielectric constant | Dk@10 GHz | none | 3.65 | 3.60 | 3.50 | 3.60 | 3.52 | 3.50 |
| Dissipation factor | Df@10 GHz | none | 0.0059 | 0.0052 | 0.0043 | 0.0062 | 0.0045 | 0.0043 |
| Branch-like pattern on laminate surface | visual inspection | none | none | none | serious | none | none | none |
| Flame retardancy | UL 94 | none | V-0 | V-0 | V-1 | V-0 | V-0 | V-0 |

TABLE 11

Divinylbenzene compound (DVB) volatility determination

| | Gelation time of varnish (SG) | Gelation time of prepreg (PG) |
|---|---|---|
| DVB was added as a part of prepolymer, i.e., E1-E18 and C9-C10 | 280-300 seconds | 150-180 seconds |
| DVB was added individually as one component, i.e., C1, C4 and C6 | 280-300 seconds | 320-400 seconds |

Based on the test results from Table 6 to Table 10, it is apparent that the Examples according to the present disclosure (E1 to E18) are superior to the Comparative Examples. For example, all samples in the Examples of the present disclosure meet the requirements of no branch-like pattern on the surface of a copper-free laminate and the ratio of thermal expansion of a laminate being of less than or equal to 1.25%.

Comparison of Example E2 and Comparative Examples C1-C4 and C6-C8 shows that when the prepolymer added to the resin composition is obtained by prepolymerizing the divinylbenzene compound, the allyl resin and the acrylate resin according to the present disclosure, the ratio of thermal expansion of a laminate is lowered, the TMA Tg is increased, and the modulus decay ratio of a laminate is lowered.

From the test results in Table 11, it is observed that during the preparation of resin composition varnishes, if the divinylbenzene compound (DVB) is added individually as one component, the gelation time of varnish SG (280-300 seconds) as measured above will be shorter than the gelation time of prepreg PG (320-400 seconds). If the divinylbenzene compound, the allyl resin and the acrylate resin are prepolymerized and then the prepolymerized resin is added to the resin composition, the gelation time of varnish SG (280-300 seconds) as measured above will be longer than the gelation time of prepreg PG (150-180 seconds).

Comparison of Example E2 and Comparative Examples C1, C4 and C6 shows that, during the preparation of the resin composition and the article made therefrom according to the present disclosure, if the divinylbenzene compound, the allyl resin and the acrylate resin are prepolymerized and then the prepolymerized resin is added to the technical solution according to the present disclosure, the gelation time of varnish SG (280-300 seconds) as measured above will be longer than the gelation time of prepreg PG (150-180 seconds), and the dissipation factor Df as measured is 0.0044; in contrast, if the divinylbenzene compound is added individually as one component, the gelation time of varnish SG (280-300 seconds) as measured above will be shorter than the gelation time of prepreg PG (320-400 seconds), and the dissipation factor Df as measured is 0.0050-0.0054. This observation indicates that the polymerization of the divinylbenzene compound, the allyl resin and the acrylate resin may inhibit volatilization of the divinylbenzene compound and lower the dissipation factor of a laminate made from the resin composition.

In addition, during the preparation of resin composition varnishes, if the triallyl isocyanurate resin (TAIC) is added individually as one component, white mist can be observed at the baking stage during the preparation of prepregs; under the same preparation conditions, white mist is not observed when TAIC is not added, indicating that the volatilization of TAIC is the cause of white mist; in contrast, if TAIC is prepolymerized with the divinylbenzene compound and the methyl methacrylate resin and then the prepolymerized resin is added to the resin composition, no white mist is observed, indicating that TAIC is not volatilized.

Comparison of Example E2 and Comparative Examples C1, C2 and C8 shows that prepolymerization of the divinylbenzene compound, the allyl resin and the acrylate resin may inhibit volatilization of the allyl resin, the glass transition temperature of laminates made from the resin composition is increased, and the ratio of thermal expansion is lowered. Comparison of Example E2 and Comparative Examples C9-C10 shows that when the phosphorus-containing flame retardant in the resin composition is Di-DOPO, the glass transition temperature of the laminate is increased, the TMA Tg of the laminate is higher than its DMA Tg, the ratio of thermal expansion of the laminate is lowered, the T300 thermal resistance and the copper foil peeling strength are both increased, and the modulus decay ratio of the laminate is lowered.

Comparison of Example E2 and Comparative Examples C11-C12 shows that when the prepolymer in the resin composition is a prepolymer of the divinylbenzene compound, the allyl resin and the acrylate resin according to the present disclosure and the phosphorus-containing flame retardant has a structure of Di-DOPO, the glass transition temperature of the laminate is increased, the TMA Tg of the laminate is higher than its DMA Tg, the ratio of thermal expansion of the laminate is lowered, the T300 thermal resistance and the thermal resistance after moisture absorption are both increased, the copper foil peeling strength of the laminate is increased, and the modulus decay ratio of the laminate is lowered.

Comparison of Example E2 and Comparative Example C5 shows that when the prepolymer added to the resin composition is a prepolymer of the divinylbenzene compound, the allyl resin and the acrylate resin, the ratio of thermal expansion (50-260° C.) is unexpectedly and significantly lowered. E2 has a ratio of thermal expansion (50-260° C.) of 0.9%. Compared with C5 which has a ratio of thermal expansion (50-260° C.) of 1.8%, E2 achieves an unexpected result in the ratio of thermal expansion which is lowered by 0.9%; in addition, the TMA Tg of the laminate is higher than its DMA Tg, and the laminate has a high copper foil peeling strength.

Moreover, the analysis of the test results shows that, if the content of the prepolymer is 10-60 parts by weight, the content of the Di-DOPO is 20-60 parts by weight, and the composition used for making the prepolymer at least comprises 10-50 parts by weight of the divinylbenzene compound, 10-40 parts by weight of the acrylate resin and 30-70 parts by weight of the allyl resin, the present disclosure further achieves other unexpected results. For example, laminates made from E1-E8 have a TMA Tg higher than their respective DMA Tg, indicating that the laminates made from the resin compositions have a low ratio of thermal expansion below the glass transition temperature and therefore have low dimensional change; in addition, the copper foil peeling strength of all laminates is greater than or equal to 3.5 lb/in.

The above detailed description is merely illustrative in nature and is not intended to limit the embodiments of the subject matter or the application and uses of such embodiments. As used herein, the term "exemplary" means "serving as an example, instance, or illustration." Any implementation described herein as exemplary is not necessarily to be construed as preferred or advantageous over other implementations.

Moreover, while at least one exemplary example or comparative example has been presented in the foregoing detailed description, it should be appreciated that a vast number of variations exist. It should also be appreciated that the exemplary one or more embodiments described herein are not intended to limit the scope, applicability, or configuration of the claimed subject matter in any way. Rather, the foregoing detailed description will provide those skilled in the art with a convenient guide for implementing the described one or more embodiments. Also, the scope defined by the claims includes known equivalents and foreseeable equivalents at the time of filing this patent.

What is claimed is:

1. A resin composition comprising 5 to 70 parts by weight of a prepolymerized resin and 10 to 70 parts by weight of a phosphorus-containing flame retardant, wherein:

the prepolymerized resin is prepared by prepolymerization of a composition which at least comprises 5 to 60 parts by weight of a divinylbenzene compound, 25 to 75 parts by weight of an allyl resin and 5 to 50 parts by weight of an acrylate resin; and the phosphorus-containing flame retardant has a structure of DOPO-Ar-DOPO, wherein DOPO represents a 9,10-dihydro-9-oxa-10-phosphaphenanthrene-10-oxide group, and Ar represents benzene, naphthalene or anthracene.

2. The resin composition of claim 1, wherein the allyl resin comprises a triallyl resin.

3. The resin composition of claim 1, wherein the acrylate resin comprises a mono-functional acrylate resin, a bifunctional acrylate resin, a multi-functional acrylate resin or a combination thereof.

4. The resin composition of claim 1, wherein the composition at least comprises 10 to 50 parts by weight of the divinylbenzene compound, 10 to 40 parts by weight of the acrylate resin and 30 to 70 parts by weight of the allyl resin.

5. The resin composition of claim 1, wherein the phosphorus-containing flame retardant comprises a compound of Formula (I):

Formula (I)

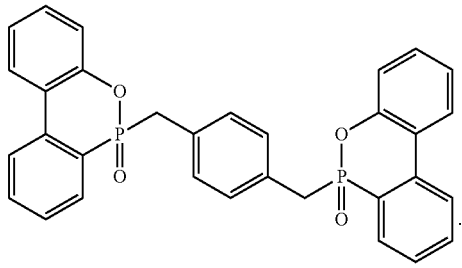

6. The resin composition of claim 1, comprising 10 to 60 parts by weight of the prepolymerized resin and 20 to 60 parts by weight of the phosphorus-containing flame retardant.

7. The resin composition of claim 1, further comprising divinylbenzene compound, allyl resin, acrylate resin, maleimide resin, polyphenylene ether resin, cyanate ester resin, polyolefin resin, epoxy resin, phenolic resin, benzoxazine resin, styrene maleic anhydride resin, polyester resin, amine curing agent, polyamide resin, polyimide resin or a combination thereof.

8. The resin composition of claim 1, further comprising flame retardant, inorganic filler, curing accelerator, solvent, toughening agent, silane coupling agent or a combination thereof.

9. An article made from the resin composition of claim 1, comprising a resin film, a prepreg, a laminate or a printed circuit board.

10. The article of claim 9, which has a surface absent of branch-like pattern under visual inspection.

11. The article of claim 9, having a ratio of thermal expansion as measured by reference to IPC-TM-650 2.4.24.5 of less than 1.30%.

12. An article made from the resin composition of claim 6, comprising a resin film, a prepreg, a laminate or a printed circuit board.

13. The article of claim 12, having a glass transition temperature as measured by reference to IPC-TM-650 2.4.24.4 of less than a glass transition temperature as measured by reference to IPC-TM-650 2.4.24.5.

14. The article of claim 12, having a copper foil peeling strength as measured by reference to IPC-TM-650 2.4.8 of greater than or equal to 3.5 lb/in.

15. A method of making the article of claim 9, comprising subjecting the composition to prepolymerization to prepare the prepolymerized resin and then adding the prepolymerized resin to the resin composition comprising the phosphorus-containing flame retardant.

* * * * *